United States Patent
Levi et al.

(10) Patent No.: US 6,703,318 B1
(45) Date of Patent: Mar. 9, 2004

(54) METHOD OF PLANARIZING A SEMICONDUCTOR DIE

(75) Inventors: Amitay Levi, Cupertino, CA (US); Gian Sharma, San Jose, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 0 days.

(21) Appl. No.: 10/423,270

(22) Filed: Apr. 25, 2003

(65) Prior Publication Data (65)

Related U.S. Application Data

(60) Provisional application No. 60/422,314, filed on Oct. 29, 2002.

(51) Int. Cl.[7] ............................................. H01L 21/302
(52) U.S. Cl. ....................................... 438/736; 424/435
(58) Field of Search .................................. 438/691–695, 438/424–427, 435, 633, 706, 723, 733–738

(56) References Cited

U.S. PATENT DOCUMENTS 5,928,960 A * 7/1999 Greco et al. ................ 438/692
6,498,072 B2 * 12/2002 Azuma ....................... 438/427
6,541,324 B1   4/2003 Wang

* cited by examiner

Primary Examiner—Matthew Smith
Assistant Examiner—Calvin Lee
(74) Attorney, Agent, or Firm—Gray Cary Ware & Freidenrich LLP

(57) ABSTRACT

A method of CMP planarizing a silicon dioxide layer on a silicon nitride in the semiconductor die is disclosed. A wafer has a plurality substantially identical semiconductor dies defined on the wafer. Each of the dies is separated from one another by a scribe line. A layer of silicon nitride is formed on the planar surface of the wafer where the silicon nitride has a top surface which is substantially parallel to the planar surface. A layer of silicon dioxide is deposited on the top surface with the silicon dioxide varying in height above the top surface. A mask is formed across the wafer, including on the scribe line, where the mask has a plurality of locations with each location having a differing density of gap-to-pillar ratio, which is proportional to the height of the silicon dioxide above the top surface. The silicon dioxide is anisotropically etched through each gap of the mask across the entire wafer where each gap is etched by the same amount in the height direction. CMP is then used to planarize the silicon dioxide to the top surface of the silicon nitride across the entire wafer.

15 Claims, 4 Drawing Sheets

METHOD OF PLANARIZING A SEMICONDUCTOR DIE

The present application claims the priority of a Provisional Application 60/422,314 filed on Oct. 29, 2002, whose disclosure is incorporated herein by reference in its entirety.

TECHNICAL FIELD

The present invention relates to a method of planarizing a layer of a first material, and more particularly a dieletric layer, using chemical mechanical polishing techniques on a semiconductor die.

BACKGROUND OF THE INVENTION

Chemical mechanical polishing (CMP) is a well-known method to planarize a material used in semiconductor processing. Typically, the material to be planarized is a dieletric, such as silicon dioxide, which has been deposited on another dieletric such as silicon nitride. Further, the silicon nitride has a top planar surface with the silicon dioxide deposited thereon. However, because there are trenches in the substrate and with holes in the silicon nitride leading to the trenches, the silicon dioxide deposited on the silicon nitride will flow through the holes in the silicon nitride into the trenches in the substrate, thereby causing an uneven level above the top planar surface of the silicon nitride. Thus, the height of the silicon dioxide above the top planar surface of the silicon nitride can vary substantially. In the CMP method, it is desired to polish or remove the silicon dioxide so that it is planar with the top planar surface of the silicon nitride.

One prior art method to attempt to level the silicon dioxide is to create artificial dummy diffusion regions in the substrate of large field areas and filling it with oxide, but this does not address the large active areas and CMP's dishing effect associated with the large active areas. In other words, this method alone does not address the problem of the planarization of all the areas of the wafer. Another prior art solution is to mask certain portions of the silicon dioxide where the height of the silicon dioxide above the top planar surface of the silicon nitride is substantial. The silicon dioxide in the masked portion is removed thereby removing a substantial portion of the silicon dioxide in the portion where the height of the silicon dioxide above the top planar surface is substantial. This, however, creates a well-known undesired effect called "dishing" wherein polishing of the silicon dioxide causes the removal of silicon nitride in certain areas Finally, in an article entitled "Using Smart Dummy Fill and Selective Reverse Etch Back for Pattern Density Equalization," by Brian Lee, Duane S. Boning, Dale L. Hetherington, and David J. Stein, published in CMP-MIC conference dated March, 2000, the authors suggested a dummy mask with a certain lay out density patterns and then removing silicon dioxide from just those selected etch back cells wherein a certain percentage of the underlying silicon dioxide is removed and is inverse to that of the targeted film density. This technique, however, suffers from the disadvantage that it does not take into account silicon dioxide across the entire wafer of semiconductor substrate, including silicon dioxide between the scribe lines separating the dies.

SUMMARY OF THE INVENTION

Accordingly, in the present invention, a method of planarizing a first material on a second material of a semiconductor die is disclosed. A plurality of substantially identical semiconductor dies are defined on a semiconductor wafer with the wafer having a planar surface. The plurality of dies are separated from one another by a scribe line. A layer of the second material is formed on the planar surface of the semiconductor wafer, wherein the layer of the second material has a top surface which is substantially parallel to the planar surface. A layer of the first material is on the top surface and the layer of the first material varies in a height direction above the top surface. A mask is formed across the wafer, where the mask has a plurality of locations with each location having differing density of gap-to-pillar ratio, which is proportional to the height of the first material above the top surface. The first material is anisotropically etched through each gap of the mask across the entire wafer wherein each gap is etched by the same amount in the height direction. CMP is then used to planarize the first material to the top surface across the wafer.

BRIEF DESCRIPTION OF THE DRAWINGS

FIG. 3C is a cross-sectional view of the structure shown in FIG. 3B after the mask has been applied and etched.

DETAILED DESCRIPTION OF THE INVENTION

Figure 1:
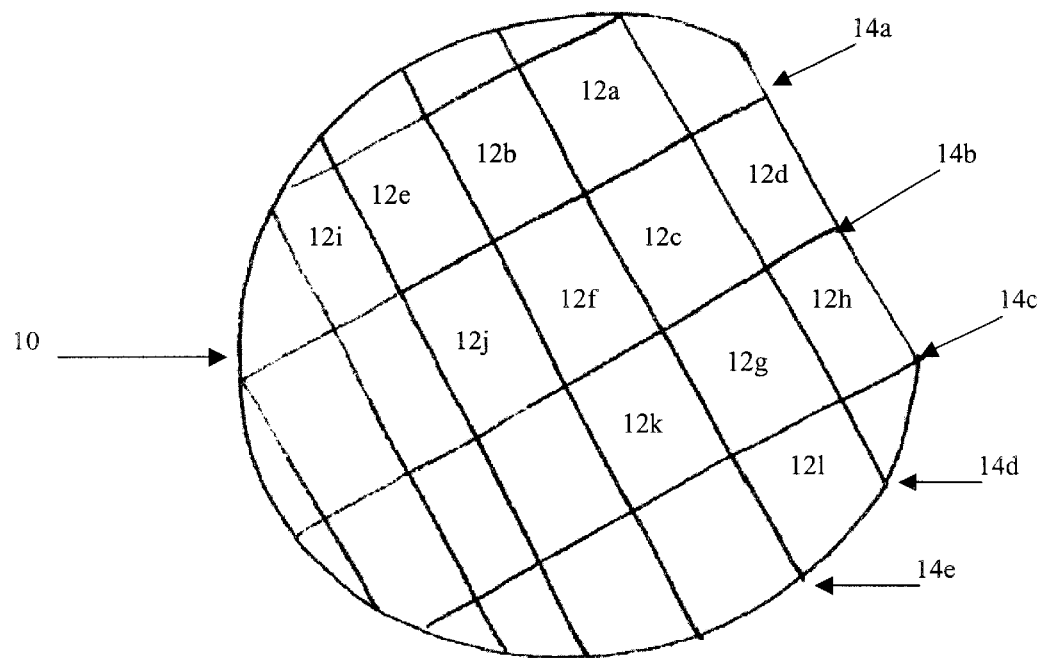
FIG. 1 is a top view of a wafer having a plurality of substantially identical semiconductor dies defined thereon and having a first material thereon to be planarized in accordance with the method of the present invention.

Referring to FIG. 1, there is shown a top view of a wafer 10 of a semiconductor substrate. Typically, the semiconductor substrate 10 is single crystalline silicon or it may be a composite semiconductor, such as a III–V material. The wafer 10 has defined thereon a plurality of substantially identical semiconductor dies 12, with each die 12 separated from one another by a scribe line 14. The wafer 10 is characterized by having a substantially planar top surface 16. In the method of the present invention, as well as in the prior art, a thin layer 20 of silicon dioxide is deposited or thermally grown on this top surface 16 of the substrate 10. The layer 20 of silicon dioxide can be, although not necessarily, used as the gate oxide for MOS transistors and the like. Deposited on the first layer 20 of silicon dioxide is a layer 22 of silicon nitride. The silicon nitride has a planar surface 24, which is substantially parallel to the top surface 16 of the semiconductor substrate 10.

Figure 2:
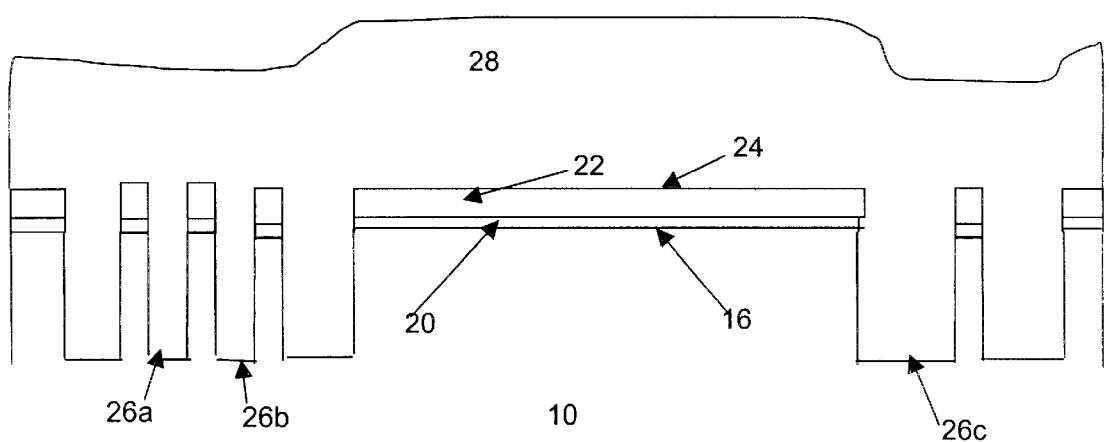
FIG. 2 is a partial cross-sectional view of one semiconductor die shown in FIG. 1 of an exemplar profile of the silicon dioxide which is grown on silicon nitride and is desired to be planarized.

Typically, trenches 26(a–c) are etched into the silicon nitride 22 and through the silicon dioxide 20 and into the silicon substrate 10. Finally, a layer of silicon dioxide 28 fills the trenches 26(a–c) and is also deposited on top of the planar surface 24 on the silicon nitride 22. In one embodiment, the layer 28 of silicon dioxide is deposited by HDP (high density plasma) deposition. The silicon dioxide 28 is deposited on the planar surface 24 of the silicon nitride 22 and into the trenches 26(a–c) but does not form a planar surface which is parallel to the planar surface 24. Instead, because the silicon dioxide 28 "fills" the trenches 26, the thickness of the silicon dioxide 28 above the planar surface 24 of the silicon nitride 22 will vary. An exemplary cross-sectional view of a die 12 is shown in FIG. 2. In the method of the present invention, it is desired to planarize the silicon dioxide 28 such that the resultant structure would be planar and would align with the top planar surface 24 of the silicon nitride 22. It should be noted that the layer 20 of silicon dioxide, layer 22 of silicon nitride, and layer 28 of silicon nitride is applied across the entire wafer 10, including over the scribe lines 14. Of course, as can be seen by the trenches 26 in FIG. 2, this does not mean that layers 20 and 22 are everywhere on the top surface 16 of the substrate 10.

Figure 3A:
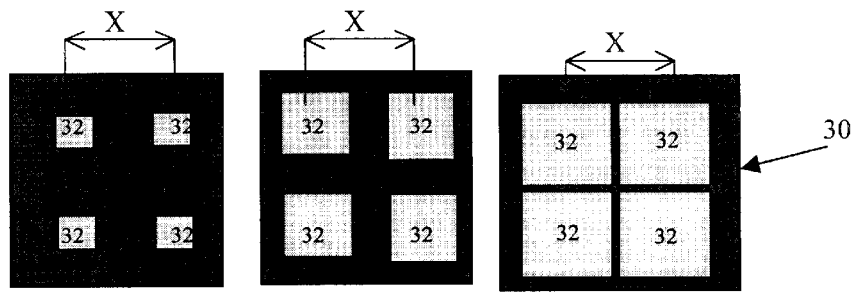
FIG. 3A is a top view of one method of the present invention using a mask in which a field has a plurality of pillars with different sizes but with the gaps between adjacent pillars all being the same size.
Figure 3B:
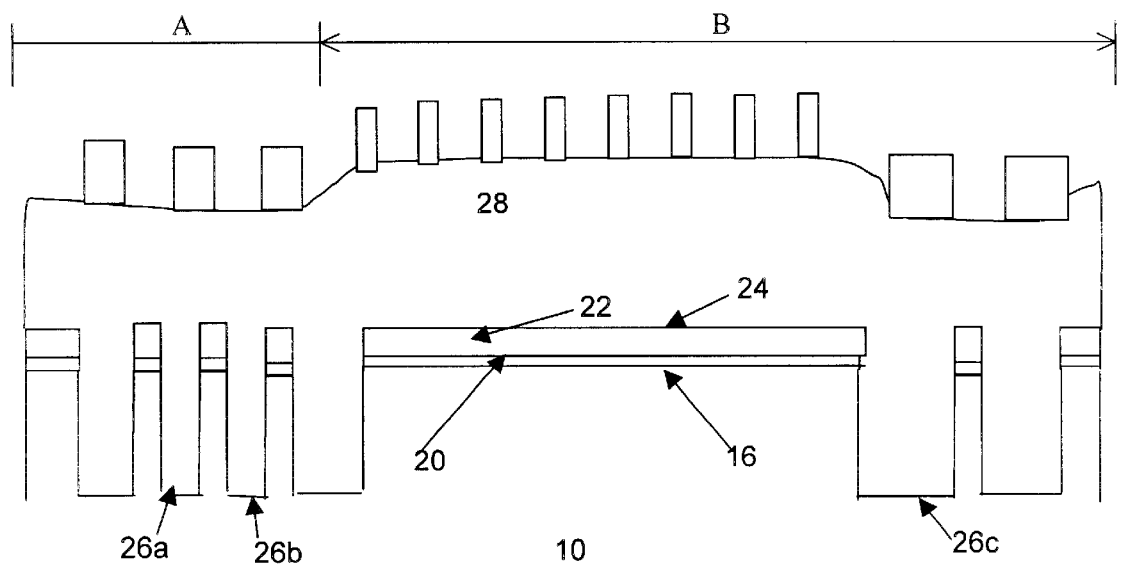
FIG. 3B is a cross-sectional view of the mask pattern using the mask shown in FIG. 3A on the structure shown in FIG. 2.

There are two methods to planarize the silicon dioxide 28. In the first method, as shown in FIG. 3A, a mask is first applied to the contour of the silicon dioxide 28. The mask comprises a plurality of substantially identical fields 30, which are shown in FIG. 3A. Each of the fields 30 is substantially identical or congruent. Within a field 30, there are pillars 32 and gaps. A pillar 32 is a cross-sectional area and in the preferred embodiment, it is substantially square in shape. A gap is defined as the distance from the center of a pillar 32 to the center of an adjacent pillar 32. Thus, as shown in FIG. 3A, although there are different sized pillars 32, the gap distance X is the same for each of the three fields 30 shown in FIG. 3A. Thus, in the first method of the present invention, a mask is formed comprising of a plurality of congruent fields 30, each having one or more pillars 32 that have different sizes, but with gaps all of the same size. The size of each pillar, i.e., the cross-sectional dimension of the pillar 32, is dependent upon the thickness of the silicon dioxide 28 above the planar surface 24 upon which the fields 30 are placed. Thus, as shown in FIG. 3B, the structure therein has two regions designated "A" and "B."

In the region designated "A," the thickness or the amount of silicon dioxide 28 which is on the planar surface 24 of the silicon nitride 22, is substantially less than the thickness of the silicon dioxide 28 in the region designated "B." This variation in the thickness of the silicon dioxide 28 would cause an inverse variation in the density of pillar-to-gap ratio that is formed on the silicon dioxide 28. In particular, where the thickness is small, as in region A, the density of pillar-to-gap ratio is large in comparison to region B, where the thickness of the silicon dioxide 28 is large and density of pillar-to-gap ratio is small.

To determine the thickness of the silicon dioxide 28 or the material to be planarized in each different regions and therefore to create the necessary mask with its appropriate pillar size but with constant gap size, one can perform the determination in one of two ways. First, the thickness at each region can be calculated based upon the anticipated thickness due to the number of trenches in the selected region. For example, since in region A there are two trenches 26a and 26b, whose depths are known, it can be calculated what the ultimate thickness of the silicon dioxide 28 in region A would be due to a portion of the silicon dioxide 28 in that region A used to fill the trenches 26a and 26b, thereby lowering the height of the silicon dioxide 28 in region A. Similarly, for region B, the calculations can be made based upon the size of the trench 26c and the volume of silicon dioxide which would flow to fill the trench 26c thereby lowering the height of the silicon dioxide 28 in that region. Thus, a computer can be used to calculate the height or thickness of the silicon dioxide 28 in various regions and therefore to calculate the density of the pillar-to-gap ratio in those regions. The computer must know the information of the pattern layout on the mask used to etch the trenches as well as the depth of the trench plus the thickness of the layers 20 and 22.

Alternatively, this can be found empirically by examining the SEM (scanning electron microscope) view of the cross-sectional area after the deposition of the layer 28 for a select die. Once that is known, the layout of the fields 30 necessary to be produced with the appropriate density for that process can be determined. There will be several different pillar layout patterns corresponding to the density of the pillars needed after the anisotropic etch.

Based upon either of these methods, after a mask with the plurality of fields 30 is applied on the entire wafer, including over the scribe line 14 (with the resultant structure of a portion of the die shown in FIG. 3B), an anisotropic etch is performed. The silicon dioxide 28 between gaps which are the regions between adjacent pillars 32 which are formed on the contour of the silicon dioxide 28 is anisotropically etched. Each gap is etched into the silicon dioxide 28 by the same thickness amount Y. The resultant structure is shown in FIG. 3C.

Finally, the wafer 10 with the structure shown in FIG. 3C is then subject to a conventional CMP polishing method. As a result, after the CMP processing of the wafer 10 with the structure shown in FIG. 3C, the silicon dioxide 28 would reach the planar surface 24 of the structure.

Figure 4A:
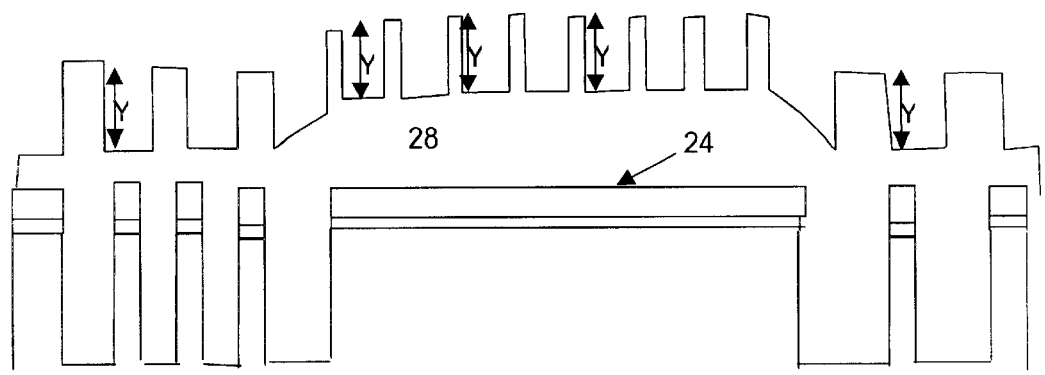
FIG. 4A is a top view of another method of the present invention using a mask in which a field has a plurality of pillars with the same size but with the gaps between adjacent pillars all being different.
Figure 4A:
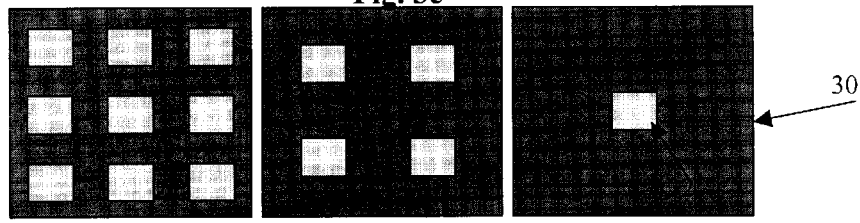
Figure 4B:
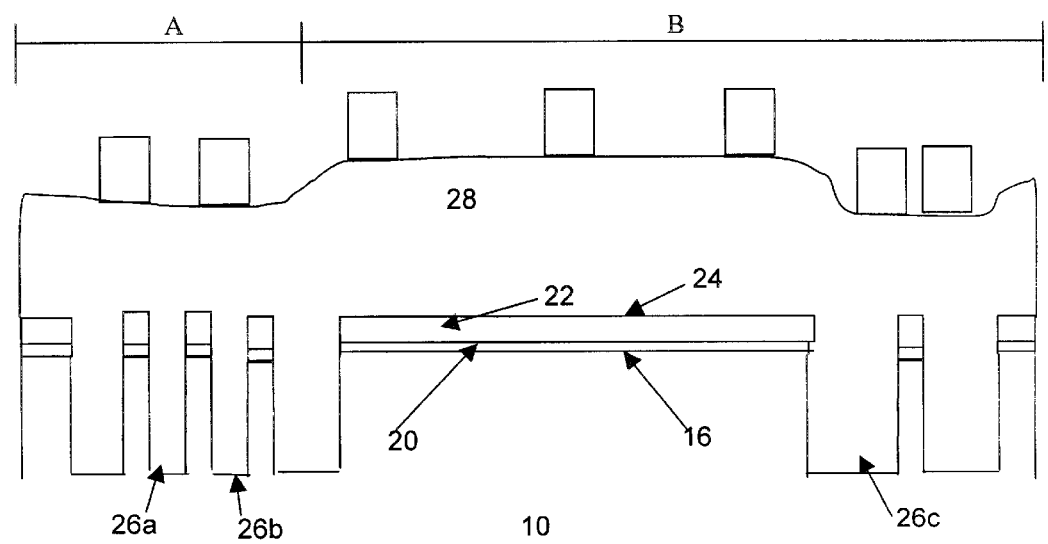
FIG. 4B is a cross-sectional view of the mask pattern using the mask shown in FIG. 4A on the structure shown in FIG. 2.

Referring to FIG. 4A, there is shown another method of the present invention. In the second method of the present invention, again, the fields 30 are congruent and of the same size. However, one or more pillars 32 of the same size are formed in each field 30, with the gap between each pillar being different. The density of the pillar 30 to the gap would depend upon the "height" of the silicon dioxide 28 upon which the fields are fixed, plus the thickness of layers 20 and 22. Again, a mask in which the fields 30 are placed on the contour of the silicon dioxide 28 is formed, resulting in the formation of a number of regions in which within each region the fields are congruent but the pillar-to-gap ratio differs.

Figure 4C:
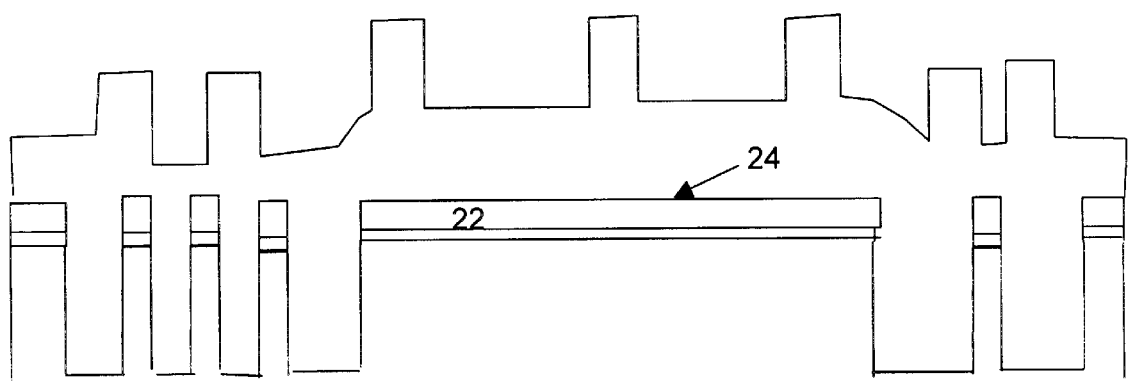
FIG. 4C is a cross-sectional view of the structure shown in FIG. 4B after the mask has been applied and etched.

Similar to the foregoing explanation with regard to the processing for the structure shown in FIG. 3B, after the fields 30 are formed on the contour of the silicon dioxide 28, the silicon dioxide 28 between adjacent pillars or in the gaps are anisotropically etched. Once again, similar to the process described above with regard to FIG. 3C, the silicon dioxide 28 is anisotropically etched by the same amount Y in the "height" direction, resulting in the structure shown in FIG. 4C. The structure shown in FIG. 4C is then CMP polished and the resultant structure would be the silicon dioxide 28 being substantially planar to the planar surface 24 of the silicon nitride 22.

The theory of the present invention is as follows. When a mask whose pillar-to-gap density ratio is inversely proportional to the "height" of the silicon dioxide 26 is applied, a subsequent CMP polishing step would cause those fields that have low density to be etch or polished faster than those fields having high density. The fields having low density represent those fields that are over portions of the silicon dioxide that are thick. Therefore, those regions will be etched faster than the regions where the silicon dioxide is 'thin". Further polishing eventually brings both portions into the same planar field.

Mathematically, this may be expressed as follows: The etch rate in a CMP process having a certain topography with density D is R/D, where R is the etch rate of a flat surface. The density D is equal to the total area of high feature (total area of pillars 32)/ divided by Total area (area of field) or (total area of pillars 32+total area of gaps). Thus, density D will always be less than or equal to 1.0. If the density is low, i.e. there is less amount of pillars, then the etch rate will be faster than if the density is high. Since density low represents the density of the mask over the region of the silicon dioxide which is thicker than the region of the silicon dioxide that is thinner, the thicker regions will be etched faster.

Various specific embodiments can be formed without detracting from the spirit of the invention. In particular, the size of a field can be of microscopic size, e.g. 50 um by 50 um.

What is claimed is:

1. A method of chemical mechanical polishing (CMP) a first material on a second material of a semiconductor die, said method comprising:
   defining a plurality of substantially identical semiconductor dies on a semiconductor wafer, said wafer having a planar surface, and wherein said plurality of dies are separated from one another by a scribe line;
   forming a layer of said second material on said planar surface wherein said layer of said second material having a top surface, substantially parallel to said planar surface;
   forming a layer of said first material on said top surface, wherein said layer of said first material varying in a height direction above said top surface;
   forming a mask across the wafer, wherein said mask having a plurality of locations with each location having differing density of gap to pillar ratio, which is proportional to the height of said first material above said top surface;
   anistropically etching said first material through each gap of said mask, across the wafer, wherein each gap is etched by the same amount in the height direction; and
   using CMP to planarize said first material to said top surface across the wafer.

2. The method of claim 1 wherein said layer of second material is silicon nitride, and wherein said layer of first material is silicon dioxide.

3. The method of claim 1 further comprising a layer of third material between said layer of second material and said wafer.

4. The method of claim 3 wherein said layer of second material is silicon nitride, and wherein said layer of first material and third material are silicon dioxide.

5. The method of claim 4 wherein said layer of second material has holes therein connecting said layer of first material and third material.

6. The method of claim 5 wherein each of said dies has trenches therein filled with said layer of first material.

7. The method of claim 6 wherein said density of gap to pillar comprises a plurality of substantially congruent fields with each field having the same size pillar but different size gap.

8. The method of claim 6 wherein said density of gap to pillar comprises a plurality of substantially congruent fields with each field having different size pillar but same size gap.

9. The method of claim 1 wherein said density of gap to pillar comprises a plurality of substantially congruent fields with each field having the same size pillar but different size gap.

10. The method of claim 1 wherein said density of gap to pillar comprises a plurality of substantially congruent fields with each field having different size pillar but same size gap.

11. A method of planarizing a first material on a second material of a semiconductor die, said method comprising:
    defining a plurality of substantially identical semiconductor dies on a semiconductor wafer, said wafer having a planar surface, and wherein said plurality of dies are separated from one another by a scribe line;
    forming a layer of a third material on said planar surface;
    forming a layer of said second material on said layer of third material, said layer of said second material having a top surface substantially parallel to said planar surface;
    masking selective portions of said layer of second material, with other portions of said layer of second material unmasked;
    etching said layer of second material, said layer of first material, and said semiconductor wafer to form trenches therein, through said other portions unmasked;
    applying said layer of said first material on said wafer, including in said trenches and on said second material, wherein said layer of said first material varying in a height direction above said top surface;
    forming a mask across the wafer, wherein said mask having a plurality of locations with each location having differing density of gap to pillar ratio which is proportional to the amount of said first material in the height direction from said top surface at said location;
    anistropically etching said first material through each gap of said mask, across the wafer, wherein each gap is etched by the same amount in the height direction; and
    using CMP to planarize said first material to said top surface across the wafer.

12. The method of claim 11, wherein said masking step further comprises:
    forming a mask covering select portions of said layer of second material with other portions unmasked; and
    removing said mask after said etching step.

13. The method of claim 12 wherein said first material and said third material is silicon dioxide, and said second material is silicon nitride.

14. The method of claim 12 wherein said density of gap to pillar comprises a plurality of substantially congruent fields with each field having the same size pillar but different size gap.

15. The method of claim 12 wherein said density of gap to pillar comprises a plurality of substantially congruent fields with each field having different size pillar but same size gap.

* * * * *